Oct. 4, 1960 J. A. A. RAPER 2,955,171

SYMMETRICAL DIODE LIMITER

Filed Feb. 18, 1957

INVENTOR:
JOHN A. A. RAPER,
BY Robert J. Steinmeyer
HIS ATTORNEY 2,955,171
Patented Oct. 4, 1960

2,955,171

SYMMETRICAL DIODE LIMITER

John A. A. Raper, Syracuse, N.Y., assignor to General Electric Company, a corporation of New York Filed Feb. 18, 1957, Ser. No. 640,885

4 Claims. (Cl. 330—24)

Figure 1:
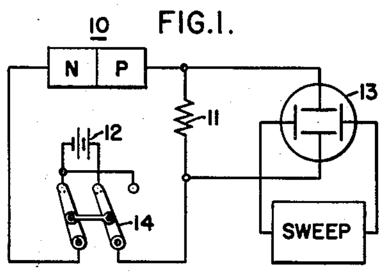

This invention relates to a symmetrical diode limiter and more particularly to a limiter employing a single junction diode capable of providing full-wave limiting action.

It has been common practice in the prior art to use semiconductor diodes in limiter circuitry. Customarily a single diode has been used to perform half-wave limiting and it has been found necessary to use circuitry employing more than one diode if it is desired to provide a circuit which will achieve full-wave limiting.

In the production of such diodes, one criterion of quality control has been to limit the storage or reverse recovery time of the diode to as small a value as is possible. This is defined as the time necessary to build up the reverse impedance of a diode after a reversal of the bias, or the time to sweep out the remaining charge carriers. This is done to provide rectification that is as perfect as is practically possible. Diodes having relatively large reverse recovery times have either been discarded or classified as low grade.

Most prior art limiting circuits employing semi-conductor diodes use the point contact variety. The junction diode is a relative newcomer and in the junction diode certain problems have presented themselves in maintaining low storage times. If the diode is biased in its forward direction, holes in the P region move toward the N region and electrons in the N region move toward the P region, thus current flows from the positive terminal to the negative. Before the bias polarity is reversed some holes remain in the P region and some electrons in the N region. Upon reversing the bias polarity, these holes and electrons are then swept from the diode and constitute a flow of current in the reverse or non-conducting direction. It is found necessary to clear these holes and electrons from the diode in order to build up the reverse impedance of the device. Reverse recovery time has been a problem in the production of junction diodes that is of greater order of magnitude than that present in point contact diodes. Much has been done to reduce this recovery time. Junction diodes having a high recovery time have been deemed objectionable. Therefore it is an object of my invention to utilize the reverse recovery time of a junction diode having a relatively long reverse recovery time in order to put diodes to practical use which have previously been considered worthless.

Another object of my invention is to provide a limiting circuit using a junction diode of relatively long recovery time to provide full-wave limiting.

A further object of my invention is to provide a multi-stage semiconductor amplifier employing junction diode limiting circuitry utilizing a minimum number of diodes to accomplish full-wave limiting.

In carrying out my invention in one form thereof, I employ a junction diode having a relatively long storage time for reverse recovery. A load circuit and an A.C. signal source are connected across the diode. The signal source provides a signal having a period which is less than four times the storage or recovery time of the diode. Thus, the diode passes sufficient current in the reverse direction during recovery to provide a substantially symmetrical full-wave, limited output across the load circuit.

Figure 2:
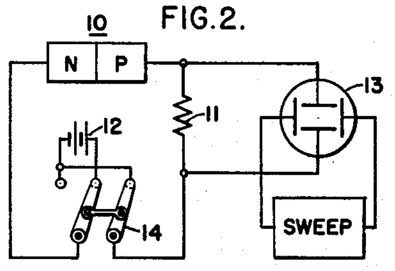
Figure 3:
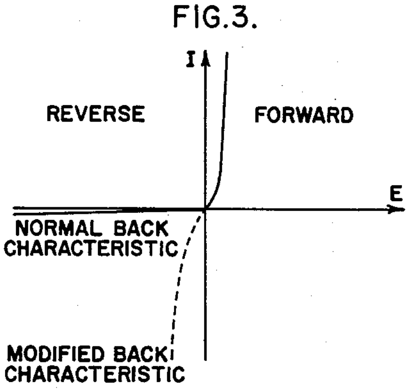
Figure 4:
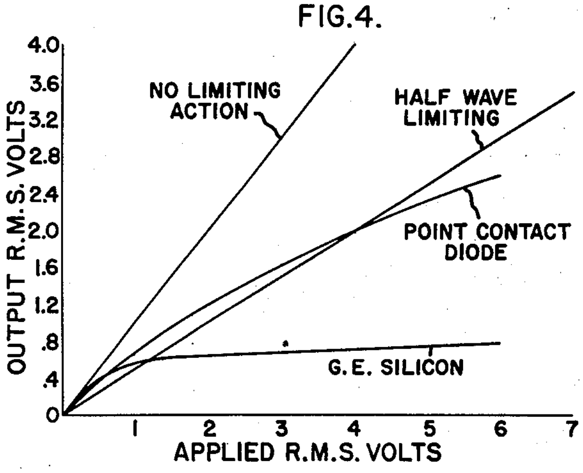
Figure 5:
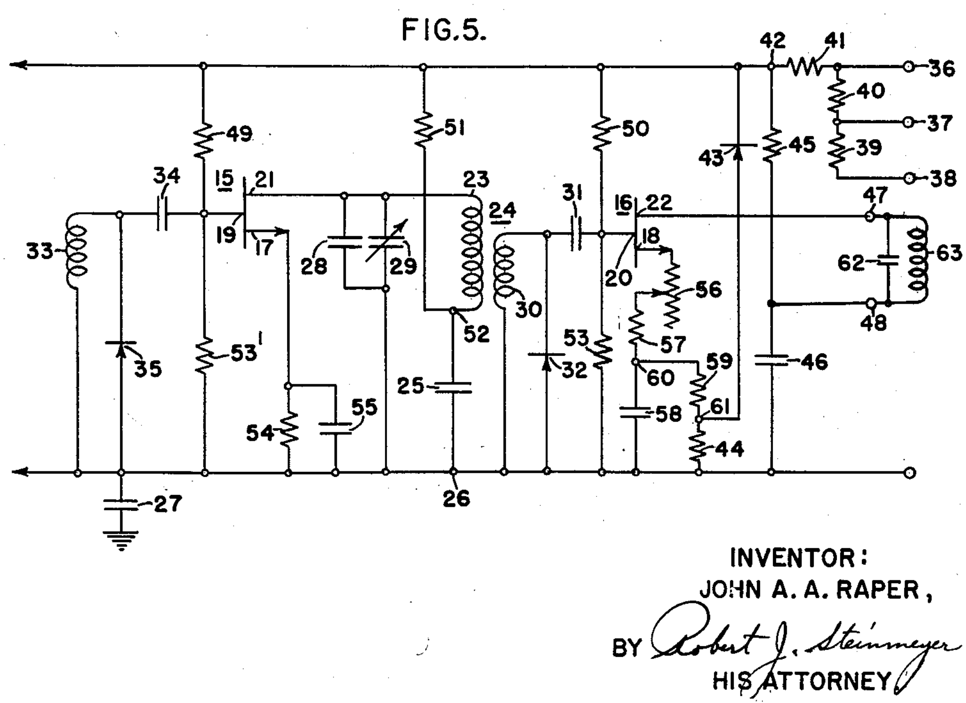

The novel features which I believe to be characteristic of my invention are set forth with particularity in the appended claims. My invention itself however, together with further objects and advantages thereof, can best be understood by reference to the following description taken in connection with the accompanying drawing in which Fig. 1 illustrates a junction diode having a potential applied to its electrodes in its forward direction and a measuring circuit for measuring the current flowing through the diode; Fig. 2 illustrates the circuit of Fig. 1 with the polarity of the applied potential reversed; Fig. 3 illustrates the characteristic curve of the diodes of Figs. 1 and 2; Fig. 4 illustrates the applied voltage versus the output voltage for circuits employing junction diode limiting, as well as for circuits using a point contact diode and circuits employing no limiting; and Fig. 5 illustrates a multi-stage semiconductor amplifier employing junction diode limiting in accordance with my invention.

Referring now to the drawing, in Fig. 1 I have illustrated a junction diode 10 connected in series with an impedance 11 across a source of unidirectional potential 12. A high impedance voltage measuring device 13 is connected across the impedance 11 in order to measure the current flow in the diode 10. The junction diode 10 has two regions, an N region and a P region as illustrated. A switch 14 is connected to the terminals of the unidirectional source 12 in a manner such that the positive terminal of the source 12 is connected to the P region of the diode 10 through impedance 11 and the negative terminal of the source 12 is connected to the N region. Thus the diode 10 is biased in its forward direction.

The operation of the circuit of Fig. 1 is as follows:

Holes in the P region move toward the N region and electrons in the N region move toward the P region, and a current flows through the diode from the positive terminal of the source 12 to the negative terminal. At all times some holes are present in the P region and some electrons in the N region.

Turning now to Fig. 2, I have illustrated the diode 10 connected as in Fig. 1 with the single exception that the switch 14 has been thrown so that the positive terminal of source 12 is now applied to the N region of the diode 10 and the negative terminal of the source 12 is applied to the P region through impedance 11. This reversal of polarity of the source 12 has the following effect: The electrons still in the N region are swept around to the positive terminal of the source 12 and the holes in the P region move toward the negative side of the source 12. This movement of holes and electrons constitutes a flow of current in the reverse or non-conducting direction. Naturally when the supply of holes is exhausted the reverse current ceases. The time during which this reverse current flows is referred to as the "reverse recovery" or "storage" time of the diode. If the battery potential is reversed rapidly enough or if an A.C. signal of sufficiently high frequency is applied across the diode 10, the diode's "back" characteristic is modified to resemble the "forward" characteristic, or, in other words, the reverse recovery effect allows sufficient current to flow in the reverse direction to substantially equal the current flow in the forward direction.

In Fig. 3, I have illustrated the normal and modified back characteristics of a junction diode. This is a typical curve for a germanium junction diode; the curve for a silicon junction diode is similar except that it is laterally displaced. Either curve may be laterally moved or biased by applying a biasing potential across the diode. The solid line labeled "normal back characteristic" shows the normal characteristic for the diode and the dashed line shows a modified characteristic which represents the situation at the instant the polarity across the diode is reversed. As time elapses and the stored holes are used up, the characteristic moves around in a clockwise direction until it reaches the normal back characteristic. I have found that, if the frequency of the applied signal is kept such that the signal period is less than four times the reverse recovery time of the diode, the result will be substantial full-wave or symmetrical limiting. Thus, the longer the reverse recovery time, the lower frequency may go without destroying symmetrical limiting. In essence, this means that diodes which were previously considered highly undesirable and worthless can now be profitably utilized in the circuitry of my invention. Since a point contact diode does not exhibit any appreciable hole storage phenomena, it cannot be used in this circuit. The recovery time of a point contact diode is usually several orders of magnitude less than that of a junction diode.

Fig. 4 illustrates output voltage of a limiting circuit using a silicon diode, one using a point contact diode and a circuit employing no limiting action. Looking more closely at Fig. 4, it can be seen that the circuit employing no limiting action yields an output of 4 volts R.M.S. for an input of 4 volts R.M.S. A point contact diode exhibits something closely approaching the curve shown for perfect half-wave limiting in which an applied voltage of 4 volts R.M.S. yields an output of 2 volts R.M.S. The curve for the silicon junction diode shows that after the applied voltage reaches approximately 1 volt R.M.S., the output will only rise from approximately 0.6 of a volt to 0.7 of a volt R.M.S. in the range of applied voltages from 1 to 6 volts. This will be true as long as the frequency of the input signal is of the order of 30 kc./sec. or higher.

In Fig. 5, I have illustrated a multi-stage semiconductor amplifier circuit employing two transistors 15 and 16 having emitter electrodes 17 and 18 respectively, base electrodes 19 and 20 respectively and collector electrodes 21 and 22 respectively. The transistor 15 is employed in an intermediate stage and the transistor 16 in an output stage. An interstage coupling means is provided by connecting the primary winding 23 of an interstage coupling transformer 24 from collector electrode 21 to one side of a capacitor 25. The other side of the capacitor 25 is connected to a common point 26 which is connected to ground through a capacitor 27. The primary 23 is also provided with a fixed capacitor 28 and a variable capacitor 29 connected in parallel from the collector 21 to the common point 26. The coupling transformer 24 has a secondary 30 which is connected to common point 26. A silicon junction diode 32 is connected across secondary 30. The base 19 of transistor 15 is provided with an input circuit similar to that of the transistor 16 employing a winding 33, which may be a secondary of an input transformer (not shown), connected from common point 26 through a capacitor 34 to base electrode 19. Again, a silicon junction diode 35 is connected across secondary 33. An appropriate source of bias potential is applied to one of the terminals 36, 37 or 38 through dropping impedances 39, 40 and 41 to provide a voltage at the terminal 42 to properly bias the amplifier. In addition, the voltage is regulated by a diode 43 connected from the terminal 42 to common point 26 through an impedance 44. An impedance 45 is connected in circuit with a capacitor 46 from terminal 42 to common point 26. Output terminals 47 and 48 are connected to collector electrode 22 and to a point between impedance 45 and capacitor 46 respectively. Biasing resistors 49 and 50 are each connected from terminal 42 to base electrodes 19 and 20 respectively. Another biasing impedance 51 is connected from terminal 42 to a point 52 between primary 23 and capacitor 25. To provide proper base biasing, base electrode 20 is connected to common point 26 through an impedance 53 and base electrode 19 is connected through an impedance 53' to common point 26.

The transistor emitters are connected as follows: Emitter 17 is connected through a parallel combination of an impedance 54 and a capacitor 55 to common point 26. Emitter 18 is connected through a variable resistance 56 in series with a fixed resistance 57 and thence through a capacitor 58 to common point 26. In addition, the emitter circuit of emitter 18 is provided with a potential divider by connecting a resistor 59 between the point 60, which lies between impedance 57 and capacitor 58, and the point 61, which lies between the diode 43 and the resistance 44. The output terminals 47 and 48 are shown with a capacitor 62 and a coil 63 connected in parallel across them. This represents the input to a discriminator filter (not shown).

In one operable embodiment of the circuit of Fig. 5, a set of values and types for the components is as follows:

| | |
|---|---|
| Transistors **15** and **16** | 2N78. |
| Coupling transformer **24** for 30 to 60 kc./sec. range. | |
| Primary winding **23** | 400 turns 10 mh. |
| Secondary winding **30** | 110 turns. |
| Secondary winding **30** | A3810/65–2 material. |
| Core material | By Arnold Engineering Co., Marengo, Illinois Molybdenum (Permalloy) 65 mh./1000 turns. |
| Capacitor **28** | 1000 $\mu\mu$ farads. |
| Capacitor **29** | 550–1600 $\mu\mu$f. |
| Capacitors **25**, **46**, **55** and **58** | .1 microfarad. |
| Capacitor **27** | 1 microfarad. |
| Capacitors **31** and **34** | .5 microfarad. |
| Diodes **32** and **35** | IN137A. |
| Secondary **33** | 110 turns. |

*Applied voltages*

| | |
|---|---|
| Terminal **36** | 51.5 volts. |
| Terminal **37** | 129 volts. |
| Terminal **38** | 259 volts. |
| Resistance **39** | 20K ohms. |
| Resistance **40** | 15K ohms. |
| Resistance **41** | 3.6K ohms. |
| Diode **43** | IN206. |
| Resistance **44** | 47 ohms. |
| Resistance **45** | 3K ohms. |
| Resistances **49** and **50** | 100K ohms. |
| Resistance **51** | 30K ohms. |
| Resistances **53** and **53'** | 10K ohms. |
| Resistance **54** | 4.7K ohms. |
| Variable resistance **56** | 10K ohms variable. |
| Resistance **57** | 240 ohms. |
| Resistance **59** | 2.7K ohms. |

The general operation of the circuit of Fig. 5 and also that embodying the above values in particular is as follows: Transistors 15 and 16 are of the n-p-n variety since serious instability problems were encountered when an attempt to use p-n-p's was made. The transistors are connected in common emitter configuration because of their greater gain capabilities in this configuration. No effort is necessary to obtain a uniform frequency response since any surplus gain is taken care of by the limiter diodes 35 and 32. The resistances connected to the various transistor electrodes are used in order to bias the transistors 15 and 16 into this common emitter configuration. The coupling transformer 24 is tuned by the capacitors 28 and 29 and feeds the output from collector 21 to the next stage at the base 20. An input signal source is applied to the secondary 33. This source may be either a prior stage or an input signal. The diode limiters 32 and 35 function similarly to the diodes shown in Figs. 1 and 2. Thus, when the input signal is of a frequency having a period less than four times the recovery time or storage time of the diodes 32 and 35, the diodes function in the manners of Figs. 1 and 2 to provide substantially symmetrical, full-wave limiting. The diodes 32 and 35 are selected to have a recovery or storage time which is as high as possible. Silicon diodes were selected for this particular application in order to satisfay stringent temperature requirements. In the last or output stage an output control potentiometer 56 is provided to set the limited output level. The values of the biasing resistors are also different in the output stage in order to permit the transistor to handle greater power levels.

The circuit of Fig. 5, as shown, is designed for suitable energization by a variety of voltages which in turn are variable over quite large ranges. In order to maintain the limiting level constant it is essential to keep the voltage actually supplied to the transistors constant or essentially so. This has been accomplished by utilizing the back or Zener characteristic of the silicon junction diode 43. The diode 43 was chosen with a Zener breakdown voltage below the lowest value to which the supply will ever fall, that is, approximately 36 volts. In this way, at all times the diode 43 is passing current in its back direction. This is necessary to maintain voltage regulation. For this application a IN206 diode was chosen. It has a Zener voltage which lies between 25 and 32 volts. Care has to be taken not to exceed the rating of 3.3 milliamps when the supply voltage rises to its maximum value from its nominal value, that is, 54 volts for the 51.5 volt setting at terminal 36, in order not to damage diode 43.

The Zener characteristic is extremely good for voltage regulation but is not perfect. If greater regulation of output or overcompensation is essential, this can be achieved by making the resistor 44 a larger portion of the total emitter resistance. With increased supply voltage the output level tends to increase, however, the current through the diode 43 increases causing an increased voltage drop across resistor 44 in the emitter lead of the output transistor. This slight additional drop reduces the emitter current and with it the output level to its original value. The larger resistor 44 is, the greater is the compensation.

In the circuit of Fig. 5 the gain per stage is approximately 25 db. Four stages may be cascaded to give 100 db gain, but it is not advisable to add a further stage due to noise difficulties.

An amplifier consisting of four stages has a total current drain of about 6.5 milliamps. Naturally if fewer stages are needed the values of the supply dropping resistors will have to be increased accordingly to prevent exceeding the permissible Zener diode current. If the level of input applied is not too high some of the limiting diodes such as 32 and 35, may be removed from certain of the stages, however, if the input level is high, instability will result unless a limiter diode is placed in each stage as the interstage circuits will then commence to oscillate.

While I have shown one embodiment of an amplifier employing diode limiters in the manner of my invention it will be apparent to anyone skilled in the art that such a diode limiter may be employed in various applications and it will thus be understood that I do not wish to be limited to the particular embodiment, since many modifications may be made, and I therefore, contemplate by the appended claims to cover any such modifications as fall within the true spirit and scope of my invention.

What I claim as new and desire to secure by Letters Patent of the United States is:

1. A semiconductor multi-stage amplifier comprising two transistors each having an emitter, a base and a collector electrode, means for biasing said transistors in common emitter configuration, interstage coupling means including a tuned transformer connected between the collector electrode of one of said transistors and the base electrode of the other of said transistors, a first junction diode limiter connected from a common point through a first coupling capacitor in said interstage coupling means to said base electrode of said other transistor, a load circuit connected between said collector electrode of said other transistor and said common point, a second junction diode limiter connected from said common point through a second coupling capacitor to said base electrode of said one transistor, a source of A.C. signal voltage connected across said second diode limiter, said first and second diode limiters having a predetermined minimum storage time for reverse recovery, and said source of A.C. signal voltage providing a signal with a period less than four times said storage time whereby said diodes will provide full wave limiting and will prevent oscillation in said interstage coupling means.

2. A symmetrical diode limiter comprising junction diode limiting means having a predetermined storage time for reverse recovery, a load circuit connected across said diode limiting means responsive to signal input means connected across said diode limiting means comprising a signal source means, the output of said signal input means consisting of alternating current, for impressing across said diode limiting means an alternating signal having a period less than four times that of said storage time, whereby said diode limiting means will pass sufficient current in both directions of polarity of said source to provide full-wave limiting across said load.

3. In combination, diode limiting means with a predetermined reverse recovery time, a load circuit connected across said means responsive to signal input means connected across said diode limiting means and comprising an alternating signal source, the output of said signal input means consisting of alternating current for impressing across said diode limiting means an alternating signal having a period less than four times said predetermined recovery time, whereby said diode limiting means will pass sufficient current in both directions of polarity of said source to cause full-wave limiting across said load circuit.

4. A symmetrical diode limiter comprising junction diode limiting means having a predetermined reverse recovery time, a load circuit connected across said diode limiting means responsive to a signal source means connected across said diode limiting means, the output of said source means consisting of alternating current providing a signal with a period less than four times said recovery time, whereby the reverse impedance of said diode limiting means will pass sufficient signal to accomplish substantially symmetrical full wave limiting across said load circuit.

References Cited in the file of this patent

UNITED STATES PATENTS

| | | |
|---|---|---|
| 2,666,816 | Hunter | Jan. 19, 1954 |
| 2,691,775 | Marcum | Oct. 12, 1954 |
| 2,819,442 | Goodrich | Jan. 7, 1958 |
| 2,823,321 | Sims | Feb. 11, 1958 |
| 2,879,409 | Holt | Mar. 24, 1959 |

OTHER REFERENCES

Armstrong: "Crystal Diodes in Modern Electronics," Radio and Television News, January 1952, pages 63–65, 127–133. (Only pages 63–65 relied on.)